United States Patent [19]

Tomaiuolo et al.

[11] Patent Number: 5,104,687
[45] Date of Patent: Apr. 14, 1992

[54] REDUCED CYCLE PROCESS FOR THE MANUFACTURE OF PRINTED CIRCUITS, AND A COMPOSITION FOR CARRYING OUT SAID PROCESS

[75] Inventors: Francesco Tomaiuolo, Moncalieri; Enrico Cassia, Turin, both of Italy

[73] Assignee: Alfachimici S.p.A., Moncalierie, Italy

[21] Appl. No.: 541,500

[22] Filed: Jun. 21, 1990

[30] Foreign Application Priority Data

Jun. 27, 1989 [IT] Italy .............................. 67520 A/89

[51] Int. Cl.$^5$ .............................................. C23C 26/00
[52] U.S. Cl. ...................................... 427/98; 427/96
[58] Field of Search .................................... 427/96, 98

[56] References Cited

U.S. PATENT DOCUMENTS

| | | | |
|---|---|---|---|
| 3,698,940 | 10/1972 | Mersereau | 427/98 |
| 4,353,954 | 10/1982 | Yamaoka | 427/96 |
| 4,425,380 | 1/1984 | Nuzzi | 427/98 |
| 4,430,154 | 2/1984 | Stahl | 427/96 |
| 4,515,829 | 5/1985 | Deckert | 427/98 |
| 4,610,895 | 9/1986 | Tubergen | 427/98 |
| 4,751,106 | 6/1988 | Wilkinson | 427/98 |
| 4,839,084 | 6/1989 | Ouhadi | 252/174.21 |
| 4,874,477 | 10/1989 | Pendleton | 204/20 |
| 4,948,630 | 8/1990 | Courduvelis | 427/98 |

FOREIGN PATENT DOCUMENTS 8803443  5/1988  PCT Int'l Appl. ................ 427/98

Primary Examiner—Shrive Beck
Assistant Examiner—Vi Duong Dang
Attorney, Agent, or Firm—Young & Thompson

[57] ABSTRACT

A process for manufacturing printed circuits provided with through holes, which comprises a cleaning pretreatment including a possible treatment by an organic solvent, a treatment in an alcaline solution of permanganate and a treatment for permanganate reduction, and a subsequent metallization treatment including a treatment for conditioning the walls of the through holes, a treatment for mordanting the copper surfaces, a precatalysis treatment, a catalysis treatment and a metallization treatment by a chemical copper both, wherein three treatments, namely reducing the permanganate, conditioning the walls of the through holes and mordanting the copper surfaces, are performed in a single step. The treatment for conditioning the walls of the through holes is performed by means of non-surfactant, water soluble polymers belonging to the group of the cationic polyelectrolytes. The composition for carrying out three treatments in a single step comprises an acid, hydrogen peroxide, a stabilizer for the hydrogen peroxide and a non-surfactant conditioner belonging to the group of the cationic polyelectrolytes.

22 Claims, No Drawings

5,104,687

REDUCED CYCLE PROCESS FOR THE MANUFACTURE OF PRINTED CIRCUITS, AND A COMPOSITION FOR CARRYING OUT SAID PROCESS

DESCRIPTION

BACKGROUND OF THE INVENTION

The present invention has for its subject a process for manufacturing printed circuits including through holes, comprising a cleaning pretreatment and a subsequent metallization treatment, wherein the cleaning pretreatment includes a possible treatment by organic solvent, a treatment in an alkaline solution of permanganate and a treatment for permanganate reduction; and the metallization treatment includes a treatment for conditioning the walls of the through holes, a treatment for mordanting the copper surfaces, a precatalysis treatment, a catalysis treatment and a metallization treatment by a chemical copper bath. The invention has also for its subject a composition for carrying out this process.

In the processes for manufacturing printed circuits it is required that the through holes are metallized in order that they become conductive for electrically connecting two or more printed faces of the circuit. The customarily used metallization process includes the electroless autocatalytic deposition of copper onto the walls of the through holes. Such process is known as the Plating-Through-Holes process (PTH). In order to deposit copper without intervention of electric current, the PTH metallization process is usually carried out by six main steps.

The first step of the PTH metallization process consists of a treatment by a surfactant degreasing and conditioning product, which has the purpose of degreasing the copper surfaces of the holed laminate by removing impressions, oily residues and the like, in order to allow a uniform etching during the subsequent mordanting treatment. Moreover this bath has the main purpose of conditioning the walls of the through holes, namely of suitably preparing them to the subsequent adsorption of catalytic particles. This function gives the name to the now considered step, which is known as the conditioning treatment. The conditioning consists in the neutralization of the negative electric charges present on the walls of the through holes, which hinder a uniform adsorption of the catalytic particles, these latter being negatively charged too.

The second step of the PTH metallization process consists of a treatment for mordanting the copper surfaces of the holed laminate, which is usually performed in a bath comprising inorganic acids, such as sulfuric acid of phosphoric acid, and stabilized hydrogen peroxide. As an alternative, solutions comprising alkaline persulfates are often used. This treatment has the purpose of uniformly roughening the copper surfaces of the laminates in order to allow a perfect adhesion of the subsequent depositions of chemical or electrolytic copper.

The third step of the PTH metallization process consists of a precatalysis treatment, usually performed in a bath containing sodium chloride or diluted hydrochloric acid, which has the purpose of protecting the subsequent catalysis bath from abnormal dilutions by water and from possible residues of copper or surfactant dragged from the foregoing baths. In effect, no intermediate rinsing is effected between the third and the fourth step.

The fourth step of the PTH metallization process consists of a catalysis treatment, which is usually performed in a bath comprising a solution based on palladium and tin chloride, acidified by hydrochloric acid. The catalysis bath allows depositing onto the walls of the through holes, suitably prepared by the foregoing treatments, a thin and uniform layer of a catalytic metal, which is capable of initiating, during the subsequent step of chemical copper plating, the electroless copper deposition.

The fifth step of the PTH metallization process consists of an acceleration treatment, which is usually performed by a solution based on inorganic acids such as fluoboric acid, hydrochloric acid, sulfuric acid and the like. The acceleration treatment has the purpose of limiting the palladium drag into the subsequent chemical copper bath, because an excessive drag of palladium could cause instability phenomena or even the complete decomposition of the chemical copper bath. Moreover, the acceleration treatment has the purpose of activating the catalytic layer deposited onto the walls of the through holes by removing the excess of tin chloride and then making the palladium extremely active. A more active catalytic layer promotes a complete covering of the walls of the through holes during the subsequent step of chemical copper deposition.

Finally, the sixth step of the PTH metallization process consists of a chemical copper deposition. During this step, copper is chemically deposited, without intervention of electric current, onto the suitably catalyzed walls of the through holes. After having completely covered with chemical copper the catalytic layer of palladium, the reaction proceeds autocatalytically by depositing copper until the desired thickness has been attained. In general, the chemical copper baths are formed by a solution of a copper salt in water, a copper complexing compound, a reducing agent and a pH regulator. These baths usually operate at a pH comprised between 11 and 13. In addition to these main components the chemical copper baths include several compounds which are present in low concentrations, such as stabilizers, surfactants and others. After the metallization in the chemical copper bath, the printed circuits may still receive further minor treatments, which are not considered here.

In manufacturing multilayer printed circuits, a specific pretreatment for cleaning the walls of the through holes, which is named "desmear", is usually needed before the PTH metallization process. This treatment has the purpose of eliminating possible residues deposited, during the boring operation, onto the walls of the through holes and particularly onto the inner copper layers. If such residues, which are formed by melted epoxy resin, are not accurately removed, during the subsequent metallization step the electric connection between the deposit on the hole wall and the inner copper layer cannot be ensured. When a more active cleaning treatment is performed onto the walls of the through holes, by attacking the epoxy resin up to a deep over 7,5 microns, such treatment is named "etch-back". In this case there is obtained a connection on three points of the chemical and electrolytic copper depositions onto the inner copper layers because, after the treatment, these latter project with-respect to the walls of the through holes.

Different methods are usually employed in order to perform the cleaning pretreatment onto the walls of the through holes. These methods are based on the use of chromic acid, concentrated sulfuric acid, an alkaline solution of permanganate, or even the plasma method is used. But among all these methods, the more employed is that based on an alkaline solution of permanganate. This method is generally performed in three steps.

The first step of the cleaning pretreatment (which in certain cases may be omitted) consists of a treatment in a bath based on an organic solvent, which has the purpose to soften the surfaces of the epoxy resin in order to allow, during the subsequent step of attack by an alkaline solution of permanganate, the obtainment of a micromordanted epoxy surface capable of successively ensuring a maximum adhesion of the chemical copper deposit. This bath may contain mixtures of organic solvents such as n-methyl-2-pyrrolidone, dimethylformamide, butylcarbitol, butylcellosolve, butylcellosolve acetate and the like, or alkaline solutions of these organic solvents in water.

The second step of the cleaning pretreatment consists in properly cleaning the walls of the through holes by a treatment in an alkaline solution based on permanganate. This solution is capable of attacking the residues left by the boring operation by an action of oxidative type, removing them from the walls of the through holes and particularly from the inner copper layers. After this treatment the walls of the through holes appear free from boring residues and very well prearranged for the subsequent chemical copper deposition. Usually these solutions are based on potassium or sodium permanganate and sodium hydroxide and they may comprise, in addition to a surfactant, a secondary oxidizer such as sodium persulfate or sodium hypochlorite. This secondary oxidizer has the purpose of keeping in the solution a high concentration of permanganate to the detriment of the manganate, which is the reduction product thereof.

The third step of the cleaning pretreatment on the walls of the through holes consists of a treatment in a neutralization bath, which performs the function of reducing the permanganate kept by the surface of the printed circuits and adsorbed on the walls of the through holes. During this step the residual permanganate is reduced in acidic ambient to manganese ion, which is soluble and therefore may easily be removed. Usually this reduction bath is based on sodium bisulfite, hydrazine, hydroxylamine or the like, and it may contain a surfactant too.

The pretreatment for cleaning the walls of the through holes before the metallization with chemical copper has been developed as a specific treatment for the multilayer printed circuit, and then it has been extended to the double face printed circuits. In effect, by this pretreatment it is possible to obtain a chemical copper metallization characterized by a high adhesion to the walls of the through holes.

Moreover by this pretreatment the metallization is performed onto a coherent surface, free from boring residues, and therefore the chemical copper deposit is dense and free from pores. The deposit obtained during the subsequent step of electrolytic copper deposition has a high density and a noticeable resistance to the subsequent thermic treatments. As a result, the printed circuits manufactured by performing a pretreatment for cleaning the through holes by means of permanganate before the chemical copper metallization may be perfectly soldered, they show a practically negligible percentage of through holes uncoupled or missing the ascended tin-lead alloy, and have very good properties of adhesion of the deposits on the walls of the through holes.

However the cleaning pretreatment on the through holes before the chemical copper metallization involves a noticeable increase in the manufacturing costs of the printed circuits, because to the cost of the proper treatment one should add the cost descending from the time needed for charging and discharging the printed circuits on frames or in baskets, once for the cleaning pretreatment of the through holes and then again for the PTH metallization process. -The additional cost of such a pretreatment is always accepted when it is applied to multilayer printed circuits, in view of the high value of the circuits of this kind, but not always the cost of this treatment may be accepted in the case of double face printed circuits, whose value is lower.

A method for reducing this cost resides in integrating the metallization process and the cleaning pretreatment by arranging a single line for cleaning and metallizing the through holes, in that the line needed for the cleaning pretreatment of the through holes is inserted immediately in front of the line for metallization by chemical copper. In this way there is no more the need for charging and discharging twice the frames of baskets. Such a method involves in all cases a high starting investment for the installation but, in addition thereto, many factories for the manufacture of printed circuits do not have available a physical space sufficient for inserting the cleaning line in front of the metallization line.

In order to simplify the process for the manufacture of printed circuits, some cycles for cleaning and metallizing the through holes have been proposed, wherein the number of needed treatments has been reduced. Two of these "short" cycles are described in the European Patent No. 0,261,424. Such short cycles are advantageous in that they reduce the overall number of treatments, but in many cases they are not sufficient for allowing to perform a metallization process integrated with a cleaning pretreatment, because many existing installations do not have available a sufficient number of tanks. In effect, as previously described, the conventional PTH metallization process requires six treatments, and the process for cleaning the through holes requires further three tanks, whereby in order to perform in a single line the complete process for cleaning and metallizing the through holes nine treatments are needed. The short cycles described in the European Patent No. 0,261,424 still require seven treatments, and therefore they cannot be directly performed in the conventional metallization lines, which are designed for performing only six treatments, with the corresponding intermediate rinsing operations. Therefore, in order to employ the new cycles, it is needed that some substantial modifications be made in the structure of the conventional metallization lines, by introducing new tanks and modifying the automated system for the transportation of the frames or baskets.

SUMMARY OF THE INVENTION

Therefore, it would be very interesting to realize an integrated process for cleaning and metallizing the through holes, which could be performed by only six main steps. In such a case the conventional metallization lines, designed for only six treatments, could be used as they are, without any substantial modification in their structure.

In view of the above, the object of this invention is to propose a new integrated cycle for cleaning and metallizing the through holes of printed circuits, which requires a number (six or less) of treatments, extremely reduced with respect to a conventional cycle.

The process according to the invention is mainly characterized in that three treatments, namely reducing the permanganate, conditioning the walls of the through holes and mordanting the copper surfaces, are performed in a single step.

Moreover, the acceleration step may be omitted by using a suitable chemical copper bath, and particularly by using a bath which operates at a very high pH (over 13), which makes unnecessary said acceleration step. Therefore, the reduced cycle according to this invention allows carrying out an integrated process for cleaning and metallizing the through holes, which requires only six treatments, instead of nine as it was needed according to the conventional processes. In certain cases, as already stated, the treatment by an organic solvent may be omitted. In such cases the number of main steps is reduced from six to five.

A comparison among different cleaning and metallization cycles is set forth in the following, by omitting all intermediate rinsing:

| CONVENTIONAL PROCESS | PROCESS ACCORDING TO EP-0.261,424 | PROCESS ACCORDING TO THIS INVENTION |
| --- | --- | --- |
| 1 SOLVENT | 1 SOLVENT | 1 SOLVENT |
| 2 PERMANGANATE | 2 PERMANGANATE | 2 PERMANGANATE |
| 3 REDUCTION | 3 REDUCTION AND CONDITIONING | 3 REDUCTION, CONDITIONING AND MORDANTING |
| 4 CONDITIONING | | |
| 5 MORDANTING | 4 MORDANTING | |
| 6 PRECATALYSIS | 5 PRECATALYSIS | 4 PRECATALYSIS |
| 7 CATALYSIS | 6 CATALYSIS | 5 CATALYSIS |
| 8 ACCELERATION | 7 CHEMICAL COPPER DEP. | 6 CHEMICAL COPPER DEP. |
| 9 CHEMICAL COPPER DEP. | | |

With the cycle according to the invention, because the number of treatments is reduced, the number of intermediate rinsing operations is reduced too, and therefore less water is consumed by the process.

On its turn, the composition according to the invention, intended to perform three treatments in a single step within an integrated cleaning and metallization process for the manufacture of printed circuits, is mainly characterized in that it contains an acid, hydrogen peroxide, a stabilizer for the hydrogen peroxide and a non-surfactant conditioning product belonging to the group of the cationic polyelectrolytes.

As already stated, the process according to this invention is based on the use of a new composition which allows carrying out three treatments in a single step, and this, also due to the omission of the acceleration step, allows reducing to six (or less) the whole number of treatments needed for performing in an integrated manner the cleaning and the metallization of the through holes of printed circuits. Therefore this process may be carried out in a conventional metallization line, wherein the number of tanks is such as to allow performing six main treatments, without requiring any substantial modification of the plant structure. Such process allows to equally handle both the double face printed circuits and the multilayer printed circuits, by lastly ensuring the obtainment of a high quality.

The new bath according to this invention, which is suitable for performing three treatments in a single step, comprises firstly two basical components which are a preferably inorganic acid, such as sulfuric acid or phosphoric acid, and hydrogen peroxide. In this acid solution the hydrogen peroxide operates both as a reducing agent with respect to a strong oxidizer such as the permanganate, and as an oxidizer with respect to copper.

The printed circuits, after treatment in an alkaline solution based on permanganate, by which the cleaning of the through holes walls is performed, are rinsed in water and then subjected to treatment in this new triple action bath. During this treatment, in a first stage the permanganate adsorbed on both the copper surfaces and the walls of the through holes is completely reduced. The reaction which describes this first stage is as follows:

$$2MnO_4^- + 5H_2O_2 + 6H^+ \rightarrow 2Mn^{++} + 5O_2 + 8H_2O$$

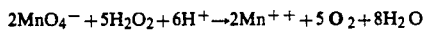

In the bath one may observe a gas generation, which is due to the oxygen formation. When the above reaction has been completed there takes place the attack and therefore the mordanting of the copper surfaces. The reaction which describes this stage is as follows:

$$Cu + H_2O_2 + 2H^+ \rightarrow Cu^{2+} + 2H_2O$$

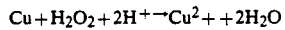

In addition to the hydrogen peroxide and to the source of hydrogen ions, the composition of this new bath comprises a third component consisting of a stabilizer for the hydrogen peroxide, which has the main purpose of reducing to a minimum the decomposition of the hydrogen peroxide both during the operating periods and during the production breaks. In effect, should the hydrogen peroxide decomposition be excessive, and therefore its concentration in the bath becomes too low, this would involve both a compromission of the reducing capacity with respect to the permanganate, which would then lead to a poor metallization of the through hole walls, and a compromission of the capacity of mordanting the copper surfaces, which could then lead to a poor adhesion of the subsequent chemical copper deposition onto the copper surfaces of the basic laminate. In order to minimize the decomposition of the hydrogen peroxide, organic stabilizers such as phenolsulfonic acid, cresolsulfonic acid, phenol, 1,3-butanediol, 1-butanol, toluenesulfonic acid, parahydroxybenzoic acid, glycolic acid, methyl ethyl ketone-2, and other products having a similar behaviour, may be used.

A fourth component of the new bath according to this invention consists of a non-surfactant conditioner. The conditioner has the main purpose of preparing the walls of the through holes for the subsequent catalysis step. Without a suitable conditioning the walls of the through holes cannot undergo a uniform catalysis both on the epoxy resin and on the glass fibers, and therefore a complete metallization by chemical copper deposition. In the conventional metallization processes, the conditioning action is usually performed by cationic surfactants based on quaternary ammonium salts or similar products. However, in the bath according to the invention it would not be possible to introduce any kind of surfactant, because it would seriously interfere with the mordanting action simultaneously performed by this bath, both by drastically slowing down the copper attack, and by depositing an organic film onto the copper surfaces. As a consequence of such an interference, the adhesion of the chemical copper deposit onto the copper surfaces of the basic laminate would be jeopardized.

In order to avoid such serious disadvantage it has been necessary to search for new conditioners having cationic nature but not being surfactants. The new non-surfactant conditioners used according to this invention comprise aqueous solutions of hydrosoluble polymers belonging to the group of the cationic polyelectrolytes, and more specifically polymers of an ester of the methacrylic acid. The general chemical formula which describes this group of polymers is as follows:

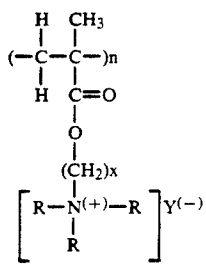

where : $x = 1$ to 5 ; $R = H$ O $CH_3$; $Y = Cl^-$, $Br^-$, $SO_4^=$, $CH_3OSO_3^-$ etc.

The molecular weight of the above new conditioners ranges between 100,000 and 5,000,000. These cationic polyelectrolytes are capable of conditioning the walls of the through holes of printed circuits in that they promote a uniform adsorption of the negatively charged catalytic particles.

The reduction in the number of the treatments needed for performing in an integrated manner the cleaning and metallization of the through holes of printed circuits is obtained, in addition to using the above described bath which allows realizing three treatments in a single step, also by eliminating the acceleration step.

In the cycle according to this invention the acceleration step may be considered as optional, but only if use is made of a chemical copper bath having suitable characteristics. According to an aspect of this invention, the modification introduced in the chemical copper bath consists of an increase in the pH at which the chemical copper bath operates. If a conventional chemical copper bath is used, by operating at a conventional pH, the omission of the acceleration step involves a serious reduction in the adhesion of the chemical copper deposited onto the copper surfaces of the basic laminate. On the contrary, if a chemical copper bath operating at a pH increased with respect to the conventional value is used, the adhesion of the chemical copper deposited onto the basic laminate is excellent even if the acceleration step is omitted.

A specific aspect of this invention is that the pH at which the operation is carried out is not constant for all chemical copper baths, but it depends upon the bath composition and, more particularly, upon the kind of copper complexing agent used. In effect, if N,N,N',N' tetra(1-hydroxypropyl)ethylenediamine is used as copper complexing agent is used, which usually operates at a pH ranging between 12 and 13 by giving good metallization results, it is sufficient that the pH is increased to values over 13 in order that the acceleration step is made unnecessary. On the contrary, if ethylenediaminetetraacetic acid is used as copper complexing agent, which usually operates at a pH ranging between 12 and 13, it is needed that the pH is further increased to values over 13.3. Such pH values are definitely anomalous for a chemical copper bath.

The present trend is to use more and more ethylenediaminetetraacetic acid as copper complexing agent in the chemical copper baths, because this complexing agent is more ecological. In effect, it may be precipitated from the exhaust chemical copper baths and therefore it may be recycled. In the process according to this invention one may use indifferently chemical copper baths formulated with one or the other of both kinds of complexing agents stated, provided that a suitable correction is introduced in the pH at which they operate; the chemical copper baths using ethylenediaminetetraacetic acid are preferable only for the above stated ecological reasons.

DETAILED DESCRIPTION OF EXAMPLES

The object of this invention will be described in more detail with the aid of the following examples.

EXAMPLE 1

A glass and epoxy laminate provided with copper on both faces, of the type FR-4, has been suitably cut and bored. The cleaning and metallization of the through holes of this circuit has been performed by using the following six-step process:

1) Treatment by an organic solvent known as CUPROLITE MLX (produced by Alfachimici S.p.A.), during 5 minutes at 30° C., then double rinsing.

2) Treatment by a bath based on alkaline permanganate, known as EPOXYMOD MLX(200) (produced by Alfachimici S.p.A.), during 10 minutes at 80 ° C. This bath operates with contents of potassium permanganate of 200 g/l and contents of sodium hydroxide of 20 g/l. This treatment is followed by a double rinsing with water.

3) Treatment, during 5 minutes at 35 ° C., by a bath according to this invention, performing the functions of reducing, conditioning and mordanting, comprising:

| | |
|---|---|
| Sulfuric acid | 150 g/l |
| Hydrogen peroxide | 20 g/l |
| Phenolsulfonic acid | 10 ml/l |
| Polymer based on ester of methacrylic acid | 0.5 g/l |
| Deionized water up to | 1 liter. |

This treatment is followed by a double rinsing with running water.

4) Treatment, during 1 minute at 25 ° C., by a precatalysis solution known as UNIPHASE MLX A (produced by Alfachimici S.p.A.), containing 200 g/l of sodium chloride and 20 ml/l of 37% hydrochloric acid. No intermediate rinsing for the passage to the catalysis step.

5) Treatment, during 5 minutes at 30 ° C., by a catalysis solution known as UNIPHASE MLX A+B (produced by Alfachimici S.p.A.). This solution, in addition to the components of the preceding solution, also contains 0.15 g/l of palladium and 15 g/l of tin chloride. This treatment is followed by double rinsing with running water.

6) Treatment, during 30 minutes at 38 ° C., by a chemical copper bath known as CUPROTHICK '84 (produced by Alfachimici S.p.A.), which operates 10 in the following conditions:

| | |
|---|---|
| Copper (under form of copper chloride) | 4 g/l |
| Formaldehyde | 4 g/l |
| N,N,N',N' tetra(2-hydroxypropyl)ethylenediamine | 0.15 M |
| pH | 13.2 |

The circuit, metallized according to the above process, has been tested in order to estimate the covering by chemical copper of the through hole walls and the adhesion between the chemical copper deposit and the copper of the basic laminate. The covering by chemical copper of the through hole walls has been estimated by observations with the scanning electron microscope (SEM) and by observations with a stereomicroscope of the light transmitted through the walls of the through holes (back-light-test). These observations have allowed to estimate that the covering by chemical copper of the through hole walls was of 100%.

The adhesion of the chemical copper deposit has been estimated by three different methods. The first method consists of the usual test of tearing an adhesive tape well adhered to the surface of the circuit metallized with chemical copper. This test evidences that the 100% of the chemical copper deposit remains adherent to the basic laminate, and there is no trace of chemical copper deposit onto the adhesive tape. In order to effect further adhesion tests, electrolytic copper is deposited up to a thickness of 25 microns onto the chemical copper surfaces of the printed circuit. On a portion of this circuit is then performed the thermic stress test according to the standard MIL P 55110 D, which includes floating on tin-lead alloy during 10 seconds at 288 ° C. and subsequent cooling in the air. In order to estimate the adhesion after this test, metallographic microsections have been effected in several points of the circuit, and it has been ascertained that at the interface between the chemical copper and the basic copper there was no trace of delamination. The remaining portion of the circuit, not subjected to thermic stress, has been practically destroyed by tearing the deposits with pliers, in several points, from the surface of the glass and epoxy laminate. In effecting this extremely severe test, no region has been noticed where the chemical copper deposit has been separated from the basic copper, and this confirms the absolute adhesion obtained.

EXAMPLE 2 (comparative)

The same process according to Example 1 has been repeated by using, in effecting step 3, a bath whose composition did not include the non--surfactant conditioner consisting of a polymer based on an ester of the methacrylic acid. As it was foreseen, in this case only a partial covering by chemical copper (70 %) of the through hole walls has been obtained, whereas the adhesion of the chemical copper deposit to the copper surfaces of the basic laminate remained excellent.

EXAMPLE 3 (comparative)

The same process according to Example 1 has been repeated by using, in effecting step 3, a bath in which the function of conditioner was carried out by a conventional cationic surfactant based on a quaternary ammonium salt, known as Lankrostat QAT (sold by Lankro Chemicals Limited). In this case a complete covering by chemical copper (100%) of the through hole walls has been obtained, but the adhesion of the chemical copper deposit to the copper surfaces of the basic laminate, tested according to the methods stated in Example 1, has been found very bad, showing noticeable delaminations between the two copper layers.

EXAMPLE 4 (Comparative)

The same process according to Example 1 has been repeated by using, in effecting step 6, the same chemical copper bath of Example 1, namely that known as CU-PROTHICK '84 (produced by Alfachimici S.p.A.), but at a pH of 12.7. In this case a complete covering by chemical copper (100%) of the through hole walls has been obtained, but the adhesion of the chemical copper deposit to the copper surfaces of the basic laminate has been found very bad, showing noticeable delaminations between the two copper layers.

EXAMPLE 5

The same process according to Example 1 has been repeated by using, in effecting step 6, a chemical copper bath having the following basic composition:

| | |
|---|---|
| Copper (under form of copper chloride) | 3 g/l |
| Formaldehyde | 3.5 g/l |
| Ethylenediaminetetraacetic acid, sodium salt | 0.18 M |
| pH | 13.6 |

The results obtained in this case are precisely the same according to Example 1, namely the covering by chemical copper of the through hole walls was complete (100 %) and the adhesion of the chemical copper deposit to the copper surfaces of the basic laminate was excellent.

EXAMPLE 6 (comparative)

The same process according to Example 1 has been repeated by using, in effecting step 6, the same chemical copper bath of Example 5, but at a pH of 13.1. In this case a complete covering by chemical copper (100 %) of the through hole walls has been obtained again, but unlike Example 5 the adhesion of the chemical copper deposit to the copper surfaces of the basic laminate has been found very bad, showing noticeable delaminations between the two copper layers.

EXAMPLE 7

The same process according to Example 1 has been repeated by using, in effecting step 6, a chemical copper bath having the following basic composition:

| | |
|---|---|
| Copper (under form of copper sulfate) | 4 g/l |
| Formaldehyde | 4 g/l |
| N,N,N',N' tetra(2-hydroxipropyl)ethylenediamine | 0.15 M |
| pH | 13.3 |

Even by using a chemical copper bath wherein the copper is under form of copper sulfate, the obtained results, both with respect to the covering of the through hole walls and with respect to the adhesion of the chemical copper deposit to the surfaces of the basic copper, have been precisely the same as according to Example 1, namely a complete covering (100 %) and an excellent adhesion.

EXAMPLE 8

The same process according to Example 1 has been applied to another glass and epoxy laminate provided with copper onto both faces, of the type FR-4, suitably cut and bored. After cleaning and metallization by chemical copper of the through hole walls, this double face circuit has been printed and processed according to the conventional technics. The finished circuit has been then flow soldered and it has been ascertained that this circuit could be soldered perfectly. There has been noticed no through hole uncoupled or missing the ascended tin-lead alloy. By effecting metallographic microsections in several points, no separation of the deposit from the through hole wall, whose epoxy resin had been uniformly micromordanted, has been noticed.

EXAMPLE 9.

The same process according to Example 8 has been repeated on a multilayer printed circuit. In this case too, excellent properties in respect of soldering have been obtained. Moreover, the examination of the metallographic microsections has revealed an excellent adhesion of the chemical and electrolytic copper deposits to the inner copper layers present on the walls of the through holes. This multilayer circuit, after flow soldering, has been subjected to a thermic stress test according to the standard MIL P 55110 D. Even in these conditions the metallographic microsections have confirmed the excellent adhesion of the chemical and electrolytic copper deposits to the inner copper layers.

EXAMPLE 10

A glass and epoxy laminate provided with copper on both faces, of the type FR-4, has been suitably cut and bored. The cleaning and metallization of the through holes of this circuit have then been performed by using the following 6-step process:

1) Treatment by a bath known as CUPROLITE MLX 88 (produced by Alfachimici S.p.A.), during 10 minutes at 70° C., followed by double rinsing with water. The used bath is based on an alkaline solution of a glycol ether.

2) Treatment, during 10 minutes at 80° C., by a bath known as EPOXYMOD MLX(60) (produced by Alfachimici S.p.A.), which operates with contents of potassium permanganate of 60 g/l and contents of sodium hydroxide of 40 g/l. This treatment has been followed by a double rinsing with water. The first of these two rinsing operations may possibly be replaced by a static washing in a diluted solution containing sulfuric acid and hydrogen peroxide, in order to perform a first reduction of the permanganate and thus extending the duration of the subsequent reducing, conditioning and mordanting bath.

3) Treatment, during 5 minutes at 25° C., by a bath according to this invention, performing the three functions of reducing, conditioning and mordanting, comprising:

| Phosphoric acid | 200 g/l |
| Hydrogen peroxide | 40 g/l |
| Para-hydroxybenzoic acid | 0.5 g/l |
| Polymer based on ester of methacrylic acid | 2 g/l |
| Deionized water up to | 1 liter. |

This treatment is followed by a double rinsing with running water.

4) Treatment, during 1 minute at 25° C., by a precatalysis solution known as UNIPHASE MLX A (produced by Alfachimici S.p.A.).

5) Treatment, during 5 minutes at 30° C. by a catalysis solution known as UNIPHASE MLX A+B (produced by Alfachimici S.p.A.). This treatment is followed by double rinsing with running water.

6) Treatment, during 30 minutes at 38° C., by a chemical copper bath known as CUPROTHICK '84 (produced by Alfachimici S.p.A.), which operates at a pH of 13.2.

The circuit, metallized according to the above process, has been tested according to the methods set forth in Example 1. From the examination it appeared that the covering by chemical copper of the through hole walls was complete (100%) in this case too, and that the adhesion of the chemical copper deposit to the copper surfaces of the basic laminate was excellent.

It is therefore ascertained that the process according to the invention, carried out by using, for one of its steps, a bath having a particular composition according to the invention too, allows to perform, with only six (or less) main treatments, the production of completely satisfactory printed circuits.

It should be understood that different modifications and all replacements by technically equivalent means may be made to what has been set forth above, without departing from the spirit of the invention and the scope of this Patent.

We claim:

1. In an electroless metal plating process for manufacturing printed circuits including through holes, comprising a cleaning pretreatment and a subsequent metallization treatment, wherein the cleaning pretreatment includes a treatment in an alkaline solution of permanganate and a treatment for permanganate reduction, and the metallization treatment includes a treatment for conditioning the walls of the through holes, a treatment for mordanting copper surfaces, a precatalysis treatment, a catalysis treatment and a metallization treatment by a chemical copper bath, the improvement that three treatments, namely reducing the permanganate, conditioning the walls of the through holes and mordanting the copper surfaces, are performed in a single step, the treatment for conditioning the walls of the through holes being performed by means of nonsurfactant water soluble polymers, belonging to the group of the cationic polyelectrolytes, said metallization comprising directly depositing a metallized layer on surfaces of the through holes without intervening non-metallic layers.

2. The process as set forth in claim 1, wherein the treatment for reducing the permanganate is performed by means of hydrogen peroxide in acid medium.

3. A process as set forth in claim 2, wherein said hydrogen peroxide in acid medium also acts as oxidizer with respect to the copper surfaces.

4. A process as set forth in claim 1, wherein the metallization treatment is performed in a chemical copper bath in which the source of copper ions consists of a copper salt belonging to the group comprising copper chloride, copper sulfate, copper fluoborate and copper nitrate.

5. A process as set forth in claim 4, wherein the metallization treatment is performed in a chemical copper bath operating at a pH over 13 and in the presence of a copper complexing agent consisting of N,N,N,', N'-tetra(2-hydroxypropyl)-ethylenediamine, or a derivative thereof.

6. A process as set forth in claim 4, wherein the metallization treatment is performed in a chemical copper bath operating at a pH over 13.5 and in the presence of copper complexing agent consisting of salts of ethylenediaminetetraacetic acid, or derivatives thereof.

7. A process as set forth in claim 1, wherein the cleaning pretreatment includes treatment in a water soluble organic solvent belonging to the group comprising N-methyl-2-2-pyrrolidone and dimethylformamide.

8. A process as set forth in claim 1, wherein the pre-cleaning treatment includes treatment in an organic solvent in an aqueous solution in an alkaline medium of at least one water soluble organic solvent belonging to the group consisting of propylenglycolmonomethylether and dipropylenglycolmonomethylether.

9. A process as set forth in claim 1, wherein the treatment is an alkaline permanganate solution is performed in a solution containing sodium permanganate or potassium permanganate.

10. A process as set forth in claim 9, wherein the treatment in an alkaline permanganate solution is performed in a solution containing potassium permanganate in a concentration ranging between 150 and 250 g/l, and sodium hydroxide in a concentration ranging between 15 and 30 g/l.

11. A process as set forth in claim 9, wherein the treatment in an alkaline permanganate solution is performed in a solution containing potassium permanganate in a concentration ranging between 48 and 80 g/l, and sodium hydroxide in a concentration ranging between 30 and 50 g/l.

12. A process as set forth in claim 1, wherein the precatalysis treatment is performed in a solution containing 200 g/l of sodium chloride and 20 ml/l of 37 % hydrochloric acid.

13. A process as set forth in claim 1, wherein the precatalysis treatment is performed in a solution containing 300 m/l of 37 % hydrochloric acid.

14. A process as set forth in claim 1, wherein the catalysis treatment is performed in an acid solution based on palladium and tin chloride, with contents of palladium ranging between 0.05 and 0.20 g/l and contents of tin chloride ranging between 5 and 20 g/l.

15. A process as set forth in claim 1, wherein the catalysis treatment is performed in an alkaline solution based on palladium under ionic form.

16. A process as set forth in claim 1, wherein the catalysts treatment is performed in a solution based on copper or copper and palladium.

17. A process as set forth in claim 1, wherein the catalysis treatment is performed in a solution based on a noble metal.

18. A process as set forth in claim 1, which is used for manufacturing double face, rigid, flexible or flexirigid printed circuits.

19. A process as set forth in claim 1, which is used for manufacturing multilayer, rigid, flexible or flexirigid printed circuits.

20. A process as set forth in claim 1, wherein the treatment for cleaning and metallizing the through holes of printed circuits (double face or multilayer) is performed in a conventional metallization line, without any substantial modification of its structure.

21. A process as set forth in claim 1, wherein said single step is performed in a composition which contains an acid, hydrogen peroxide, a stabilizer for the hydrogen peroxide and a non-surfactant conditioning product belonging to the group of cationic polyelectrolytes.

22. In an electroless metal plating process for manufacturing printed circuits including through holes, comprising a cleaning pretreatment and a subsequent metallization treatment, wherein the cleaning pretreatment includes a treatment in an alkaline solution of permanganate and a treatment for permanganate reduction, and the metallization treatment includes a treatment for conditioning the walls of the through holes, a treatment for mordanting copper surfaces, a precatalysis treatment, a catalysis treatment and a metallization treatment by a chemical copper bath, the improvement that three treatments, namely reducing the permanganate, conditioning the walls of the through holes and mordanting the copper surfaces, are performed in a single step, the treatment for conditioning the walls of the through holes being performed by means of nonsurfactant water soluble polymers, belonging to the group of cationic polyelectrolytes said metallization treatment being performed in a chemical copper bath in the presence of a copper complexing agent selected from the group consisting of N,N,N',N'-tetra(2-hydroxypropyl)-ethylenediamine, ethylenediaminetetraacetic acid, and a derivative of one of these two complexing agents, said chemical copper bath operating at a pH over 13 when N,N,N', N'-tetra(2-hydroxypropyl)-ethylenediamine or a derivative thereof is used, and operating at a pH over 13.5 when ethylenediaminetetraacetic acid or a derivative thereof is used, said metallization comprising directly depositing a metallized layer on surfaces of the through holes without intervening non-metallic layers.

* * * * *